United States Patent
Aisenbrey

(10) Patent No.: US 7,223,469 B2
(45) Date of Patent: May 29, 2007

(54) ELECTRIPLAST MOLDABLE COMPOSITE CAPSULE

(75) Inventor: Thomas Aisenbrey, Littleton, CO (US)

(73) Assignee: Integral Technologies, Inc., Bellingham, WA (US)

(*) Notice: Subject to any disclaimer, the term of this patent is extended or adjusted under 35 U.S.C. 154(b) by 0 days.

(21) Appl. No.: 10/883,915

(22) Filed: Jul. 1, 2004

(65) Prior Publication Data

US 2004/0238798 A1    Dec. 2, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/484,456, filed on Jul. 2, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*D02G 3/00*    (2006.01)
*B29C 70/86*    (2006.01)

(52) U.S. Cl. .............. 428/359; 428/361; 428/375; 428/377; 428/379; 428/381; 428/383; 428/389; 428/372; 428/373; 156/166; 156/169; 156/172

(58) Field of Classification Search ............... 428/357, 428/361, 370, 372, 373, 375, 379, 380, 389; 156/166, 180, 169, 172; 264/140, 142, 143, 264/145, 148, 171.1
See application file for complete search history.

(56) References Cited

U.S. PATENT DOCUMENTS 4,579,882 A * 4/1986 Kanbe et al. ............... 523/137
4,664,971 A    5/1987 Soens ........................ 428/288
4,788,104 A    11/1988 Adriaensen et al. ........ 428/288
4,960,642 A    10/1990 Kosuga et al. .............. 428/407
5,397,608 A    3/1995 Soens ........................ 428/34.5
5,525,423 A    6/1996 Liberman et al. ........... 428/370
6,455,143 B1   9/2002 Ishibashi et al. ......... 428/294.1

(Continued)

FOREIGN PATENT DOCUMENTS

GB    2377449 A    7/2001

*Primary Examiner*—Jill Gray
(74) *Attorney, Agent, or Firm*—Douglas Schnabel

(57) ABSTRACT

Moldable capsules of a conductive loaded resin-based material are created. The moldable capsules include a conductive element core radially surrounded by a resin-based material. The conductive loaded resin-based material includes micron conductive powder(s), conductive fiber(s), or a combination of conductive powder and conductive fibers in a base resin host. The conductive element core includes between about 20% and about 50% of the total weight of the moldable capsule in one embodiment, between about 20% and about 40% in another embodiment, between about 25% and about 35% in another embodiment, and about 30% in another embodiment. The micron conductive powders are formed from non-metals, that may also be metallic plated, or from metals, that may also be metallic plated, or from a combination of non-metal, plated, or in combination with, metal powders. The micron conductor fibers preferably are of nickel plated carbon fiber, stainless steel fiber, copper fiber, silver fiber, or the like.

26 Claims, 10 Drawing Sheets

U.S. PATENT DOCUMENTS

| | | | |
|---|---|---|---|
| 2002/0188418 A1* | 12/2002 | Kiyohara et al. | 702/156 |
| 2003/0089892 A1 | 5/2003 | Fox et al. | 252/500 |
| 2003/0111647 A1 | 6/2003 | Rosenzweig | 252/500 |
| 2004/0189170 A1* | 9/2004 | Aisenbrey | 313/248 |
| 2004/0222924 A1* | 11/2004 | Dean et al. | 343/700 MS |
| 2005/0029000 A1* | 2/2005 | Aisenbrey | 174/35 MS |

* cited by examiner

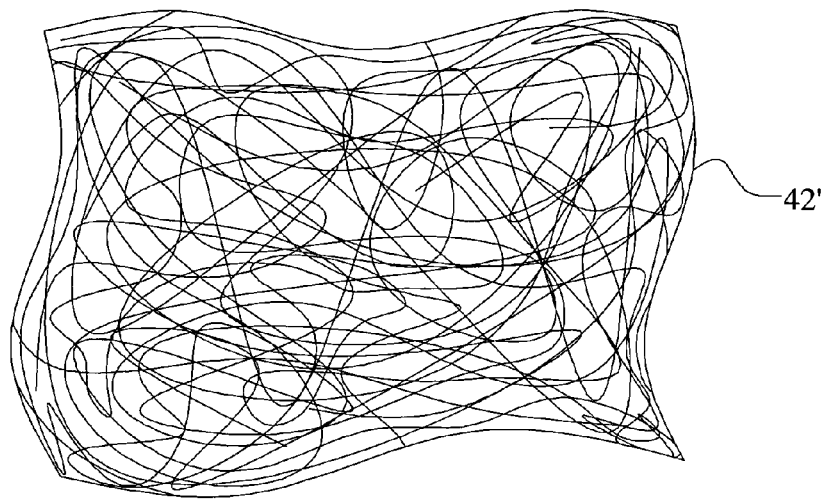
FIG. 5b
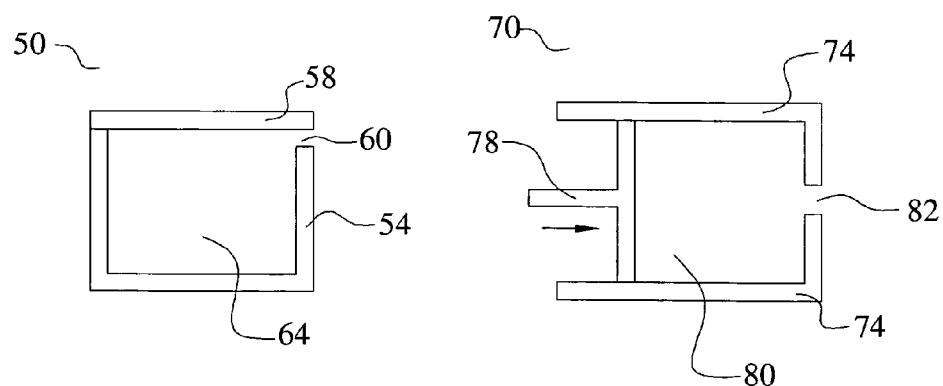
FIG. 6a
FIG. 6b

ABLE COMPOSITE
CAPSULE

This Patent Application claims priority to the U.S. Provisional Patent Application 60/484,456 filed on Jul. 2, 2003, which is herein incorporated by reference in its entirety.

This Patent Application is a Continuation-in-Part of INT01-002CIP, filed as U.S. patent application Ser. No. 10/309,429, filed on Dec. 4, 2002, now issued as U.S. Pat. No. 6,870,516, also incorporated by reference in its entirety, which is a Continuation-in-Part application of docket number INT01-002, filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sept. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to conductive polymers and, more particularly, to conductive loaded resin-based materials for molding comprising micron conductive powders, micron conductive fibers, or a combination thereof, homogenized within a base resin when molded. Even more particularly, this invention relates to a moldable capsule, and a method for forming such a moldable capsule, wherein this moldable capsule is useful for molding a conductive articles usable within the EMF or electronic spectrums.

(2) Description of the Prior Art

Resin-based polymer materials are used for the manufacture of a wide array of articles. These polymer materials combine many outstanding characteristics, such as excellent strength to weight ratio, corrosion resistance, electrical isolation, and the like, with an ease of manufacture using a variety of well-established molding processes. Many resin-based polymer materials have been introduced into the market to provide useful combinations of characteristics.

In a typical scenario, these resin-based polymer materials are manufactured in bulk quantities by a chemical manufacturer as a raw material. This raw material is then sold to a molding operation where it is molded into particular articles. This raw material form of the resin-based polymer material typically comprises a plurality of small pieces called pellets or granules. These pellets are typically of uniform size, shape, and chemical constituency. At the molding operation, the pellets are loaded into a molding apparatus, such as an injection molding machine or an extrusion machine. The pellets are typically processed through a heating and mixing process in the apparatus where the material is converted from the solid state into the molten state prior to molding.

Most resin-based polymer materials are poor conductors of thermal and electrical energy. This characteristic is advantageously used in many applications. For example, the handles of metal cooking pans are frequently covered by a molded polymer material to provide a cool handling point for the heated pan. Many electrical interfaces, such as light switches, use resin-based polymers to prevent electrical exposure to the operator. This characteristic can be disadvantageous, however, in extending the use of resin-based polymer materials to applications long dominated by metal materials. For example, it is desirable to reduce weight of electrical and electronic circuit components used in airplanes. These components frequently comprise electrically conductive materials, such as copper, that add substantial weight to an airplane. Replacement of copper with a resin-based material would reduce the weight of the component and, by extension, the entire airplane. Unfortunately, most resin-based materials are not electrically conductive enough to be used as conductors.

Attempts have been made in the art to create intrinsically and non-intrinsically conductive resin-based materials. Intrinsically conductive resin-based materials incorporate molecular structures into the polymer to increase the conductivity of the material. Unfortunately, intrinsically conductive resin-based materials are expensive and provide only limited increases in conductivity. Non-intrinsically conductive resin-based materials are formed by incorporating conductive fillers into the base resin material to impute an increased conductivity to the composite material. Metallic and non-metallic fillers have been demonstrated in the art to provide substantially increased conductivity in the composite material.

Conductive resin-based materials formed using conductive fillers, as currently formulated in the art, suffer from several well-known problems. First, to achieve a high conductivity (low resistivity), a large amount of conductive filler may have to be used. However, as the amount of conductive filler increases, substantial molding problems can occur. For example, rapid wearing of molding machine components can occur. In addition, the desired material properties of the resin-based material, such as durability and ease of molding, may be sacrificed. An additional and very important problem may occur during the melting/mixing phase. To achieve a molded article having predictable performance characteristics, the molten resin-based material containing the conductive filler must be carefully mixed such that a consistent amount of filler is present throughout the molten mixture. Intuitively, this can be achieved through longer or more aggressive mixing processes. However, to achieve optimal performance, it is preferred that the filler comprises very small dimensions on the micron scale. Unfortunately, this type of filler can easily be destroyed, broken, or pulverized by overly aggressive mixing. As a further complication, the typical approach in the art is to load the molding apparatus with the resin-based material and the filler as separate components. That is, pure plastic pellets and filler material are loaded into a molding mixing apparatus as separate components and then mixed together. A dry (unheated) mixing may first be performed followed by a wet (heated) mixing to achieve a molten state. It is very difficult to achieve a homogeneous mix using this prior art process without resorting to overly aggressive mixing and experiencing damaged conductive filler components.

Recently, attempts have been made in the art to combine a filler and a resin-based polymer into a single pellet. However, these composite pellets are found to create several problems. First, these pellets are essentially formulated to be convenient carriers for the conductive filler. Typically, a resin-based material is impregnated between strands or pieces of conductive filler to adhere the pieces together. A second layer, or perhaps several layers, of resin-based material are then formed over the strands or pieces to complete the pellet. Typically, composite pellets of this type found in the prior art are formulated based on percent volumes of conductive material and of plastic. However, it is found that this pellet contains only a relatively small amount, by weight, of resin-based material when compared to the amount, by weight, of filler. Typically, these composite pellets are manufactured with filler content, by weight, of greater than 90%. This pellet, therefore, does not provide anywhere near a sufficient amount of resin-based material for successfully molding an article. Therefore, when a quantity of these composite pellets is loaded into the molding mixer, an additional quantity of pure (non-filler containing) resin-based pellets must also be loaded to provide the bulk material for molding. This mixture of composite filler pellets and pure plastic pellets forms a "salt and pepper" mix of pellets that must be carefully mixed and melted prior to molding.

This "salt and pepper mix" of composite filler pellets and pure plastic pellets creates several problems. First, it is very difficult, if not impossible, to create a homogeneous mixing of the filler material throughout the molten plastic. The resin-based material surrounding the composite pellets is designed to be relatively thin and to have a lower melting point that the bulk plastic pellet material into which it is mixed. These design features are intended to allow the composite pellets to quickly release the filler material into the surrounding pure plastic pellets. However, this approach is found to be counterproductive in practice. It is found that an early release of the conductive filler increases the amount of filler breakage during mixing. In addition, unless the entire mixture is over mixed to the point of destroying the fiber structures, it is difficult, if not impossible, to achieve a homogeneous mixture. The fibers tend to gang together, to create swirls, balls, or hot spots within the mixture. If the molten mixture is over-mixed, the destruction of the fiber structures dramatically reduces the conductivity of the molded article and eliminates many of it benefits. If the molten mixture is under-mixed to protect the fiber structure, then the poor homogenization as described above will result in a molded article of very unpredictable qualities.

Further, the composite pellet and the pure plastic pellet both contain resin-based materials. It is found that any dissimilarities in the chemical properties of the actual materials used in each of the types of pellets will result in further poor homogenization and in unpredictable properties in the molded article. Generally, it is found that a very electrically inconsistent, unstable, structurally weakened, and/or poor quality article is molded when using this "salt and pepper" mixing of pellets. It is a primary objective of the present invention to provide a new molding formulation based on a moldable capsule with improved molding performance and molded article characteristics.

Several prior art inventions relate to conductive plastic materials, methods of manufacture, and articles of manufacture. For example, U.S. Pat. No. 5,397,608 and U.S. Pat. No. 4,664,971 to Soens each teach a process for manufacturing a plastic article containing electrically conductive fibers. The process taught comprises drawing a bundle of stainless steel filaments through a polyester solution, drying, impregnating (through extrusion) more of the same polyester, cutting into granules, dry mixing with thermoplastic pellets, extruding again, cutting again into pellets, dry mixing with pure plastic pellets, and molding the item. A fiber/plastic granule described has a conductive fiber content ranging from about 30% to 70% by volume (U.S. Pat. No. 5,397,608 to Soens, col. 4, lines 1–4). Based on typical resin specific gravity ranging between about 1.0 and 2.0 and typical stainless steel specific gravity of about 7.9, the above-cited volumetric-based range translates to between about 63% and 95% fiber content by weight for the granules. Additional sub-product versions of the fiber/plastic granules are described as having fiber content by weight of 93.8% (col. 6, lines 15–17), and having fiber content by weight of 87% (col. 6, lines 23–26), and having a fiber content by weight of 8% (col. 6, line 36). Molded articles are described having fiber content by weight of 4% (col. 7, line 20). This art teaches fiber/plastic granules with relatively high fiber content by weight (above 60%) that are mixed with a large amount of pure plastic prior to molding articles with relatively low fiber content by weight (less than 10%).

U.S. Pat. No. 4,788,104 to Adriaensen et al teaches the manufacture of a granular composite containing crimped stainless steel fibers for use in the injection molding of plastic articles with shielding properties against electromagnetic radiation. The process involves the steps of forming a granular composite of gear crimped stainless steel filaments embedded into a linear polyester resin and coated with a modified alkyd resin and chopped into granules. These granules are then dry mixed with another base resin granule and then extruded and chopped to form other granules that can be mixed with pure plastic to form articles. The granules are described as having fiber content by volume of between 20% and 80% (col. 3, lines 61–65). This content translates to fiber content by weight of between about 50% and about 97% based on typical resin specific gravity ranging between about 1.0 and 2.0 and typical stainless steel specific gravity of about 7.9. Exemplary articles manufactured from this material have a fiber content of about 10% by weight (col. 4, lines 49–52).

U.S. Pat. No. 6,455,143 B1 to Ishibashi et al teaches a fiber reinforced thermoplastic resin composition that has good flowability during the molding process and allows the fibers to be well dispersed in the molded product. This patent teaches the use of fibers having a high strength and elastic modulus such as carbon fibers, glass fibers, polyaramid fibers, alumina fibers, silicon carbide fibers or boron fibers for improving the mechanical properties of the molded product.

U.S. Patent Publication US 2003/0089892 A1 to Fox et al teaches an electrically conductive thermoplastic polymer composition which comprises a combination of metal fibers and metal-coated fibers. The metal-coated fibers taught in this invention are typically a non-metallic fiber such as a carbon, glass or a polymer core with a coating of silver, nickel, aluminum, chrome, tin, or lead.

U.S. Patent Publication US 2003/0111647 A1 to Rosenzweig teaches electrically conductive polymeric composites where the filler material is a combination of stainless steel that is plated with tin or a tin alloy. In this invention tin plated stainless steel fiber is cut into pellets which are then mixed with resin granules and extruded to form a conductive plastic article. The melting point of the resin is higher than that of the tin or tin alloy such that the tin plating melts during the molding operation to form conductive connections between stainless steel fibers in the final matrix. No content percentages are given.

U.S. Pat. No. 4,960,642 to Kosuga et al teaches a method of manufacturing pellets for making electromagnetic wave shielding material. In this invention, the pellets are formed by impregnating a metal fiber with a first polymer via a first extrusion process, coating the metal fiber with a desired base resin via a second extrusion process, and then cutting into a pellet form. This reference teaches against greater than 30% resin content by weight for the pellets (col. 3, lines 50–60) and teaches against forming pellets using a single step process of extruding resin directly onto the fibers (col. 6, lines 26–37, and TABLES 1 and 2).

U.S. Pat. No. 5,525,423 to Liberman et al teaches a method of manufacturing a fiber tow having fibers of plural diameters encapsulated within a polymeric material to form a two dimensional conductive layer. This invention teaches the encapsulation of the fiber tow thru extrusion and subsequently cutting the extruded composite material into plugs. The invention then teaches mixing the composite plugs with other plastics in an injection molding process to form EMI shielding items.

SUMMARY OF THE INVENTION

A principle objective of the present invention is to provide an effective moldable capsule useful for molding conductive loaded resin-based articles.

A further object of the present invention is to provide a moldable capsule exhibiting optimal properties for time-releasing conductive material into the resin-based material during melting and mixing and prior to molding.

A further object of the present invention is to provide a moldable capsule wherein a ratio of conductive loaded material and resin-based material for optimal performance of the molded article is pre-formed into the moldable capsule and, particularly, wherein it is not necessary to reduce the concentration of the conductive loaded material by mixing with pure plastic pellets.

A further object of the present invention is to provide a moldable capsule comprising various types of conductive loads and various types of base resin.

A further object of the present invention is to provide a method to form a moldable capsule comprising conductive loaded resin-based material.

A further object of the present invention is to provide a method to form a moldable capsule that is easily and predictably manufactured.

A further object of the present invention is to provide a method to form a moldable capsule that is extendable to inclusion of more than one type of conductive loaded material into the capsule load.

A further object of the present invention is to provide a method to manufacture articles from a moldable capsule comprising a conductive loaded resin-based material.

In accordance with the objects of this invention, a moldable capsule is achieved. The moldable capsule comprises a conductive element core comprising between 20% and 50% of the total weight of the moldable capsule. A resin-based material radially surrounds the conductive element core.

Also in accordance with the objects of this invention, a moldable capsule is achieved. The moldable capsule comprises a core comprising micron conductive powder in a first resin-based material. A middle layer of micron conductive fiber radially surrounds the core. A second resin-based material radially surrounds the middle layer. The combined micron conductive powder and said micron conductive fiber comprise between about 20% and 50% of the total weight of the module capsule.

Also in accordance with the objects of this invention, a method to form a moldable capsule is achieved. The method comprises extruding a resin-based material radially surrounding a conductive element core. The resin-based material and the conductive element core are sectioned into moldable capsules. The conductive element core comprises between 20% and 50% of the total weight of the moldable capsule.

Also in accordance with the objects of this invention, a method to form a moldable capsule is achieved. The method comprises extruding a first resin-based material comprising a combination of base resin and micron conductive powder. A micron conductive fiber layer is wound around the first resin-based material. A second resin-based material is extruded radially surrounding the micron conductive fiber layer. The first resin-based material, the micron conductive fiber layer, and the second resin-based layer are sectioned into moldable capsules.

Also in accordance with the objects of this invention, a method to form an article is achieved. The method comprises providing a plurality of moldable capsules each comprising a conductive element core. The conductive element core comprises between 20% and 50% of the total weight of the moldable capsule. A resin-based material radially surrounds the conductive element core. The moldable capsules are melted into a molten conductive loaded resin-based material. The molten conductive loaded resin-based material is molded into an article.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold articles of a conductive loaded resin-based material.

DESCRIPTION OF THE PREFERRED EMBODIMENTS

Figure 1:
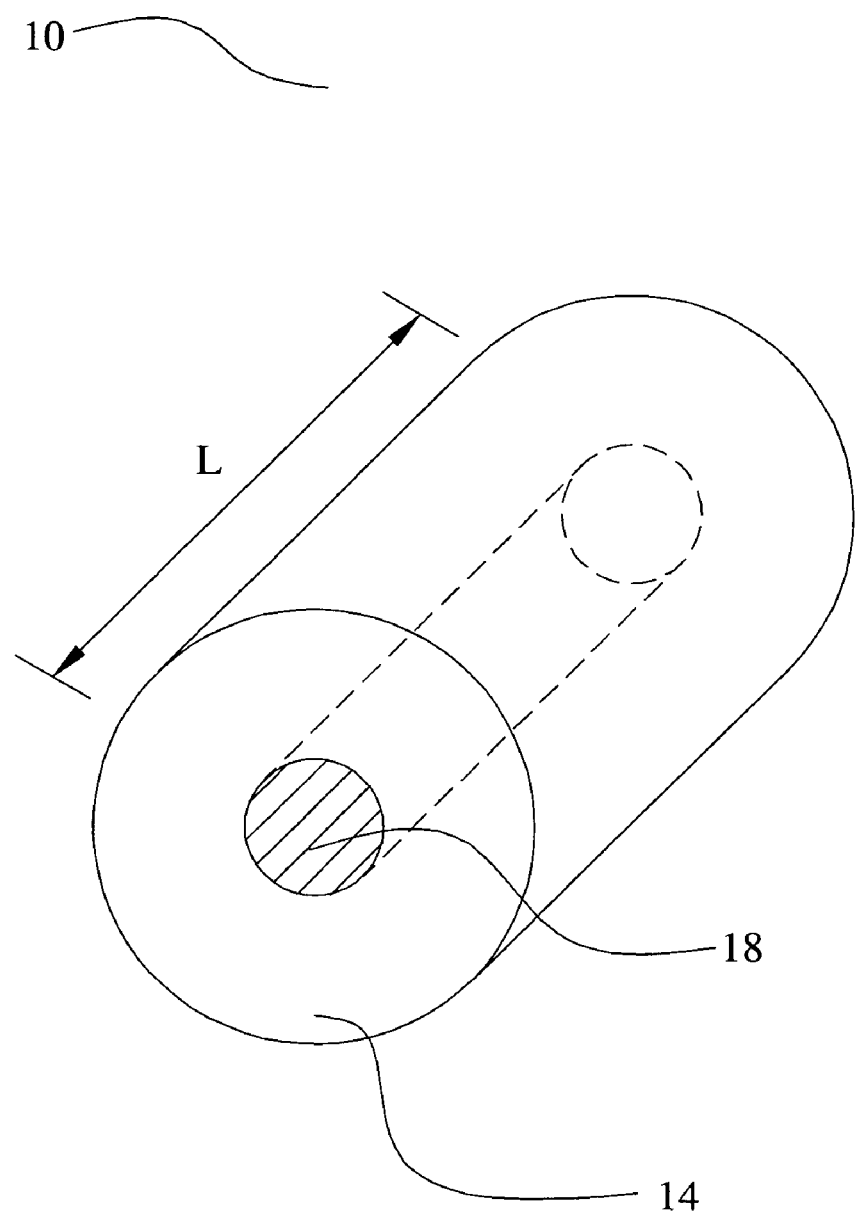
FIG. 1 illustrates a first preferred embodiment of the present invention showing a moldable capsule comprising a conductive element core with a surrounding resin-based material.

The present invention relates to conductive loaded resin-based materials comprising micron conductive powders, micron conductive fibers, or a combination thereof, homogenized within a base resin when molded. More particularly, the present invention relates to moldable capsules comprising a conductive loading material and a resin-based material that are useful in the manufacture of articles of conductive loaded resin-based materials.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of articles fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the articles are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of articles significantly lowers the cost of materials and the design and manufacturing processes used to hold ease of close tolerances, by forming these materials into desired shapes and sizes. The articles can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the articles and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming articles that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in applications as described herein.

The homogeneous mixing of micron conductive fiber and/or micron conductive powder and base resin described in the present invention may also be described as doping.

That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, articles manufactured from the molded conductor loaded resin-based material can provide added thermal dissipation capabilities to the application. For example, heat can be dissipated from electrical devices physically and/or electrically connected to an article of the present invention.

As a significant advantage of the present invention, articles constructed of the conductive loaded resin-based material can be easily interfaced to an electrical circuit or grounded. In one embodiment, a wire can be attached to conductive loaded resin-based articles via a screw that is fastened to the article. For example, a simple sheet-metal type, self tapping screw can, when fastened to the material, achieves excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the article and a grounding wire.

Referring now to FIG. 1, a first preferred embodiment of the present invention is illustrated. Several important features of the present invention are shown and are discussed below. A moldable capsule 10 is illustrated. This moldable capsule 10 comprises a conductive element core 18 radially surrounded by resin-based material 14. The conductive element core 18 comprises micron conductive fiber, micron conductive powder, or a combination of micron conductive fiber and powder. A number of specific conductive loading materials 18 and/or combination of materials 18 useful for this embodiment are described herein. The resin-based material 14 comprises a single resin-based polymer material that is moldable. A number of specific resin-based materials 14 useful for this embodiment are described of herein.

The moldable capsule 10 preferably comprises a cylindrical or somewhat cylindrical shape. That is, the moldable capsule 10 of the preferred embodiment has a definite length L. The moldable capsule 10 preferably comprises a length L of between about 2 millimeters and about 14 millimeters although longer or shorter lengths may be used. Further, the moldable capsule has a generally circular cross section. However, other cross sectional shapes may be used such as rectangular, polygonal, or even amorphous. As a key feature, however, the resin-based material 14 radially surrounds the conductive element core 18. By this, it is meant that the resin-based material 14 substantially surrounds and encases the conductive element core 18 in the direction radiating outward from the centerline where the centerline is taken along the longitudinal direction of the conductive element core 18. While the resin-based material 14 encases the conductive element core 18 along the longitudinal axis, the conductive element core 18 may be, and in the preferred embodiment is, exposed at the ends of the moldable capsule 10. This embodiment 10 of the present invention is consistent with the preferred method of formation by co-extrusion and sectioning as is further described below.

As a most important feature of the moldable capsule of the present invention, the percentage, by weight, of the conductive element core 18 of the moldable capsule 10 is carefully controlled. More particularly, in one embodiment, the conductive element core 18 comprises between about 20% and about 50% of the total weight of the capsule. In a more preferred embodiment, the conductive element core 18 comprises between about 20% and about 40% of the total weight of the capsule. In a yet more preferred embodiment, the conductive element core 18 comprises between about 25% and about 35% of the total weight of the capsule. In a yet more preferred embodiment, the conductive element core 18 comprises about 30% of the total weight of the capsule.

By carefully controlling the percentage, by weight, of the conductive element core 18 in the moldable capsule 10 within the above-described ranges, the present invention creates a novel moldable capsule 10. This moldable capsule 10 has a unique formulation and exhibits several exceptional and unexpected features not found in the prior art. In the prior art, molding pellets that contain conductive materials are formulated with a very large percentage of conductive material and, therefore, a very small percentage of plastic. A typical example is a molding pellet comprising 90% conductive materials and 10% plastic material. This type of pellet contains just enough plastic to bind, or to carry, the conductive material. To perform a molding operation using the prior art pellets, a large amount of pure plastic must be added to the conductive material-containing pellets to create a mixture with sufficient moldable plastic content. This prior art type of molding operation therefore necessitates a "salt & pepper" mixing of the prior art, conductive material-containing pellets with other, pure plastic pellets.

These prior art, conductive material-containing pellets are formulated to release the conductive material very quickly during the melt/mixing process prior to molding. To achieve this rapid release, the plastic material of the conductive material-containing pellets is selected to have a low melting point. In addition, the relatively small percentage of this plastic material, of for example 10%, allows the plastic to melt quickly and to thereby release the conductive material loading quickly. This quick release is a necessary feature of the prior art because the heavy density of conductive materials in the prior art, conductive material-containing pellets must be dispersed into the pure plastic pellets. It is found that this practice of the prior art creates several problems. By releasing the conductive materials too quickly, the structures of the conductive materials are subject to a long exposure to the mechanical mixing apparatus of the molding machine. The mechanical forces of the mixing process can easily damage the conductive material structures. For example, thin fibers can be easily broken by the mixing process. Damage to the conductive material structure adversely affects the performance of the conductive fiber in the molded article.

The very high concentration of conductive material in the prior art pellets makes it impossible to achieve a thoroughly homogeneous molten mixture of conductive material and plastic. The conductive material and the plastic material combine in a very uneven and unpredictable manner. The large local concentrations of conductive materials tend to gang together, to create swirls, balls, and/or hot spots within the base resin. Once these effects occur in the molten composite material, it is difficult, or impossible, to achieve an even homogenation short of over-mixing the material to the point of destroying the conductive loading structures or creating disruptive orientations.

Since the prior art, conductive material-containing pellets contain a first plastic material that is then admixed with a second, pure (not conductive-containing) plastic material, the resulting mixture really comprises two plastic materials. If different material types are used, then this only makes the problem of achieving a homogeneous mixing of conductive material into the molten plastic more difficult since the materials likely have somewhat different melting points and melt viscosities. Further, any mismatch between plastics in the composite mixture will cause unpredictable inter-plastic polymeric bonding. The resulting molded article exhibits structural weakness and unpredictable conductivity response. In addition, dangerous, or even fatal, gas releases or chemical reactions may be generated if two dissimilar plastics are mixed in the molten state.

By comparison, the moldable capsule 10 of the present invention utilizes a much smaller percentage, by weight, of conductive material. The novel formulation of the moldable capsule 10 of the present invention results in a moldable capsule 10 that can be directly molded to form articles without mixing with a pure, or non-loaded, pellet as in the prior art. By substantially reducing the conductive loading in the conductive element core 18, the relative amount of resin-based material 14 available for molding is increased. It is found that the novel formulation of the present invention contains sufficient resin-based material for excellent moldability without the addition of "pure" plastic pellets. This feature reduces manufacturing part count and complexity while eliminating the inter-plastic mismatching, bonding problems, non-homogeneous mixture tendencies, and potentially dangerous chemical interactions found in the prior art. The novel formulation of the present invention insures that articles molded have sufficient resin-based material from the moldable capsule alone to exhibit excellent physical, structural, and chemical properties inherent in the base resin.

Further, the novel formulation moldable capsule 10 of the present invention further provides an optimal concentration of conductive loading to achieve high electrical and thermal conductivity and exceptional performance characteristics within the EMF or electronics spectrum(s) for many applications including antenna applications and/or EMI/RFI absorption applications. The novel formulation creates a conductive loading composition and doping concentration that further creates an exceptional conductive network in the molded article. The novel formulation insures that the resulting molded article has sufficient conductive loaded material content from the moldable capsule, alone, to exhibit excellent electrical, thermal, and electromagnetic properties from a well-formed conductive network within the resin-based polymer matrix.

Further, the novel formulation of the present invention creates a moldable capsule 10 exhibiting a slow release capability. The moldable capsule 10 incorporates a relatively large amount of resin-based material 14 radially surrounding the conductive element core 18. The greater amount, by weight, of resin-based material 14, when compared to the prior art, results in a larger volume of resin-based material. This volume of resin-based material 14 must be melted by the heating of the molding apparatus mixing system before the conductive load 18 is released. As a result, a slow release property is achieved. Due to this slow release property, the inner matrix of conductive loading fibers and/or powders is dispensed and dispersed into the melted composite mixture at the right time and place in the mixing/molding cycle. The outer, resin-based material 14 enters the molten stage and the inner, conductive element core 18 disperses into this molten resin-based material to create a homogeneous mixture easily and at the right time in the mixing sequence. The use of the novel moldable capsule therefore facilitates excellent homogeneous mixing of the conductive load and the base resin and eliminates problems with both non-homogeneous mixing and with damage due to over mixing. In addition, problems of conductive material ganging, balling, swirling, and hot spots are eliminated.

The release, or separation, of the inner matrix of conductive element(s) 18 from the outer, resin-based material 14 is a critical stage in forming the composite polymer. The release, and subsequent homogenation, affects not only the structural integrity of the molded conductive loaded resin-based material, but also how this material functions as a conductor. If the separation is too fast, as in the prior art, the conductive element(s) will experience undo breakage, disruptive orientation, and will not be homogenized with the base resin evenly. These detrimental effects are due to the timing of and method of the conductive element release into the molten base resin and due to the high rotation speed of the screw, barrel friction, nozzle design and other pressures or forces exerted on the materials while being blended in preparation to be injected into the mold cavity. By comparison, the novel formulation of the moldable capsules 10 of the present invention controls the timing sequence and the orientation for the conductive element(s) 18 release cycle to thereby accurately and evenly dispense the conductive elements within the base resin. As a result, an excellent conductive network is homogeneously formed in the molded article.

Further, the novel formulation of the moldable capsule 10 of the present invention is very well suited for use with a conductive element core 18 comprising micron conductive fibers. The orientation of the micron conductive fibers, such as random, omni-directional, or parallel, in the molded conductive loaded resin-based article can significantly affect the performance of the article. As is known in the art, mold design, gating, protrusion designs, or other means within the molding apparatus, may be used to control the orientation of filler materials incorporated into a resin-based material. The slow release moldable capsules 10 of the present invention are particularly useful in facilitating the ability to control fiber directionality due to the ease with which initial homogenization occurs without over-mixing.

Further, the novel formulation of the moldable capsule 10 of the present invention provides a homogeneously mixed composite material of conductive elements and base resin that is optimized to maximize molecular interaction between the base resin polymer and the conductive elements. Equalization and intertwining of the network of conductive elements with the base resin molecular chains results in enhanced molecular properties in the base resin polymer chain including physical, electrical, and other desirable properties.

Figure 7A:
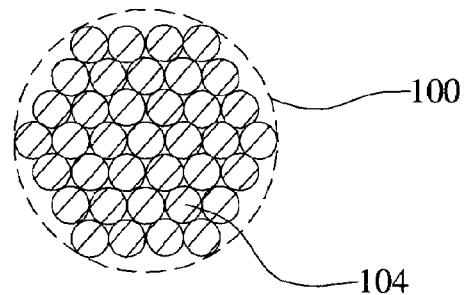
FIGS. 7a and 7b illustrate a second preferred embodiment of the present invention showing a conductive element core of a moldable capsule comprising micron conductive fiber.
Figure 7B:
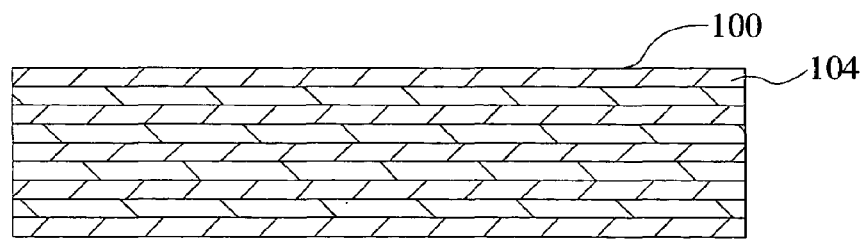

Further, the novel formulation of the moldable capsule 10 of the present invention is compatible with, and extendable in scope to, conductive element cores 18 comprises a variety of micron conductive fibers, a variety of micron conductive powders, and a variety of combinations of micron conductive fibers and/or powders. Referring now to FIGS. 7a and 7b, a second preferred embodiment of the present invention is illustrated. A conductive element core 100 comprising micron conductive fiber 104 is illustrated. Referring particularly to FIG. 7a, a cross section of a conductive element core 100 of micron conductive fiber 104 is illustrated. The micron conductor fibers 104 each have a diameter of between about 3 microns and 12 microns, and typically in the range of 10 microns or between about 8 and 12 microns. The overall bundle, or cord, comprises many individual fiber strands 104 routed together in parallel, as shown in FIG. 7b, or twisted together. Hundreds, thousands, or tens of thousands of fibers 104 are thus routed to form the cord 100. The length of the conductive element core 100 corresponds roughly to the length L of the moldable capsule, as shown in FIG. 1, since a common segmentation step cuts through both the conductive element core and the outer resin-based material.

Figure 8A:
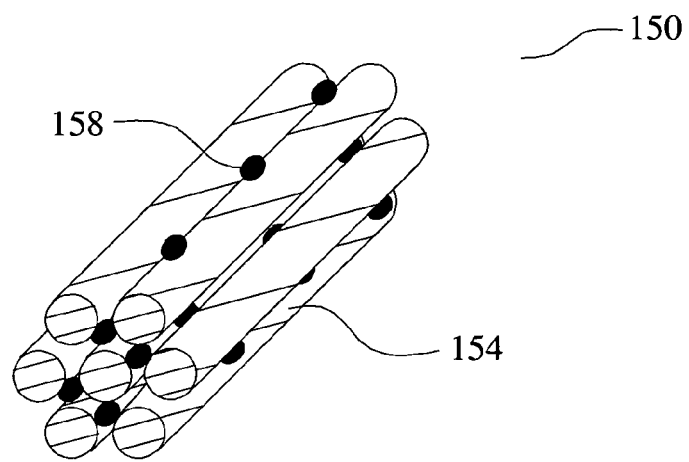
FIG. 8a illustrates a third preferred embodiment of the present invention showing a conductive element core of a moldable capsule comprising micron conductive fiber and micron conductive powder.

Referring now to FIG. 8a, a third preferred embodiment of the present invention is illustrated. The conductive element core 150 here comprises a combination of micron conductive fiber 154 and micron conductive powder 158. A number of specific micron conductive fibers 154 and micron conductive powders 148 useful for this embodiment are described herein. Again, the micron conductive fiber 154 preferably comprises a bundle, or cord, of fibers stacked or routed in parallel or twisted around a central axis. In the illustration, a few such micron conductive fibers 154 are shown. In practice, hundreds, or tens of thousands of fibers 154 are used to create a bundle or cord. If combined with a cord of micron conductive fibers 154, the micron conductive powder 158 is preferably leeched into the cord of fibers 154 as is described below. The micron conductive powder 158, along with the micron conductive fiber 154, acts as a conductor in the conductive loading network of the resulting molded article. In this case, the percentage, by weight, of the combined micron conductive fiber 154 and micron conductive powder 158 in the moldable capsule is formulated and controlled within the ranges herein described. In addition, the micron conductive powder 158 may act as a lubricant in the molding machine.

Figure 8B:
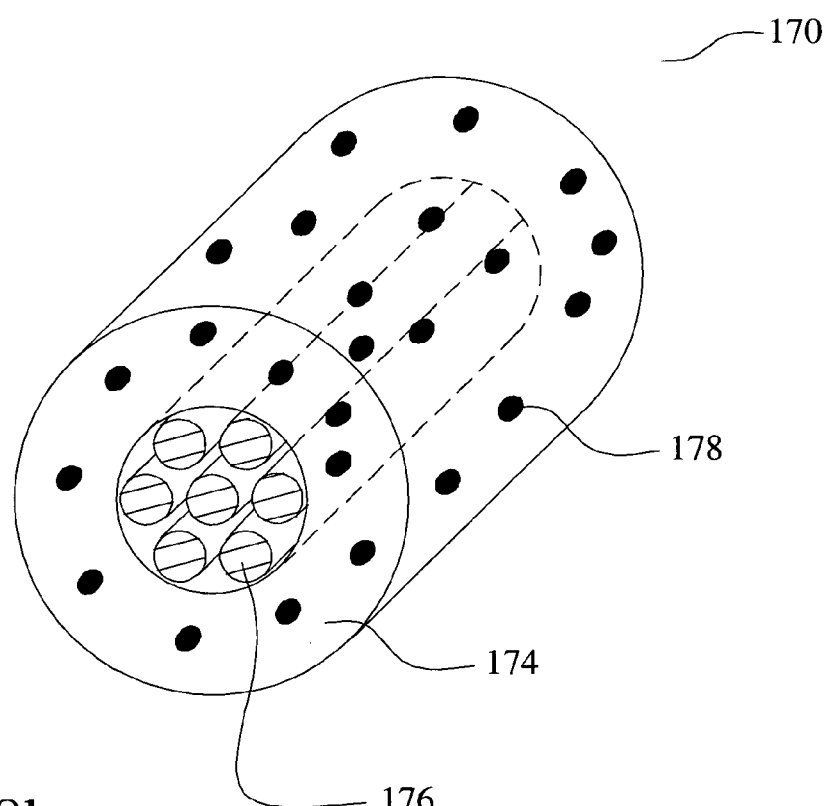
FIG. 8b illustrates a fourth preferred embodiment of the present invention showing a moldable capsule with a micron conductive fiber core surrounded by a resin-based material where micron conductive fiber is incorporated into the resin-based material.

Referring now to FIG. 8b, a fourth preferred embodiment 170 of the present invention is illustrated. Another novel moldable capsule 170 is shown wherein a conductive element core 176, comprising micron conductive fibers, is radially surrounded by resin-based material 174 as in the previous embodiment. However, in this case, the resin-based material 174 is further loaded with micron conductive powder 178. Again, the micron conductive fiber 176 in the core preferably comprises a bundle, or cord, of fibers stacked or routed in parallel or twisted around a central axis. In the illustration, a few such micron conductive fibers 176 are shown. In practice, hundreds, or tens of thousands of fibers 176 are used to create a bundle or cord. The micron conductive powder 178 in the resin-based material 174 is released when the resin-based material 174 melts. The micron conductive powder 178 acts as a conductor, along with the micron conductive fiber 176, in the conductive loading network of the resulting molded article. Again, the percentage, by weight, of the combined micron conductive fiber 176 and micron conductive powder 178 in the moldable capsule 170 is formulated and controlled within the ranges herein described. In addition, the micron conductive powder 178 may act as a lubricant in the molding machine.

Figure 9:
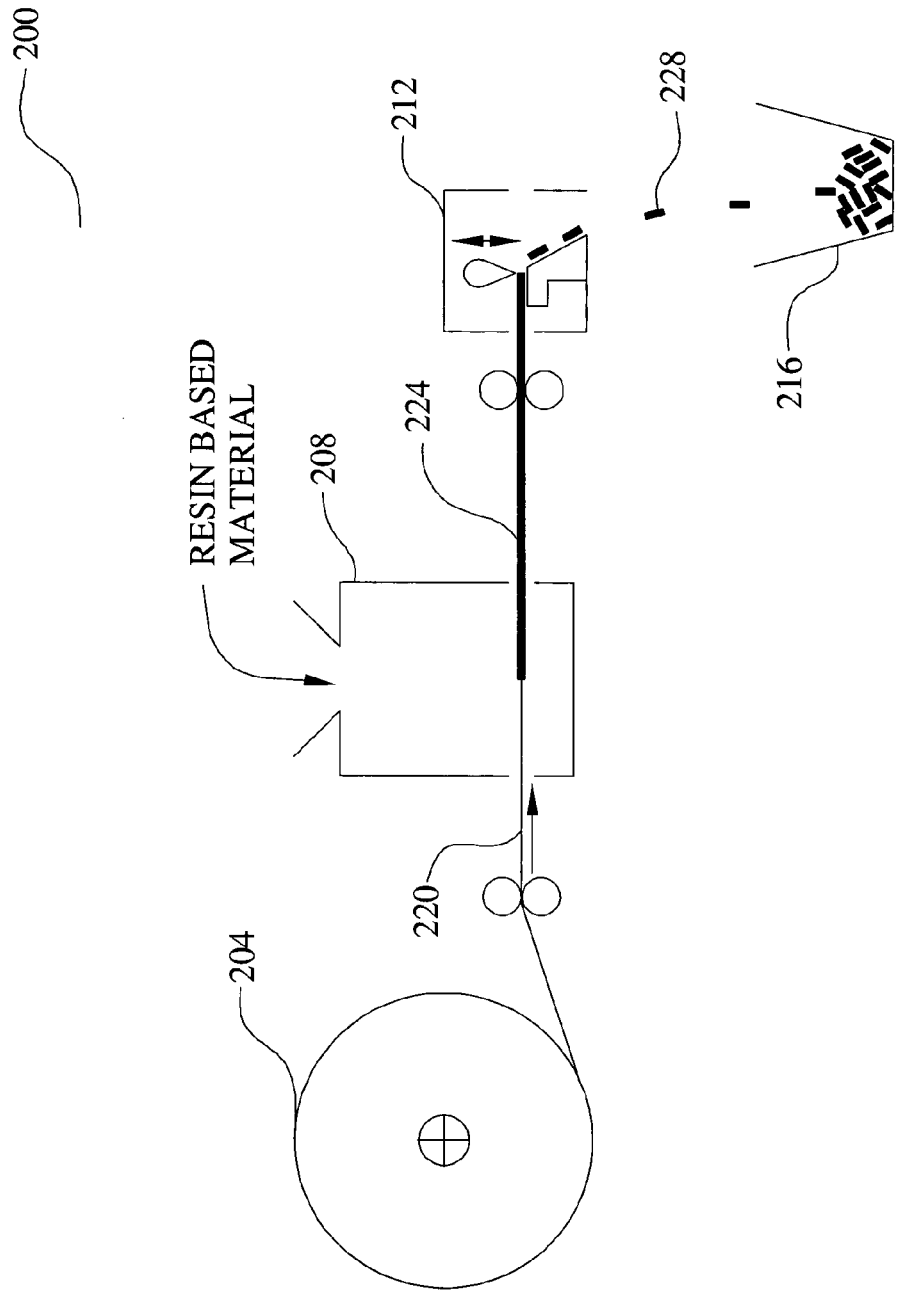
FIG. 9 illustrates a fifth preferred embodiment of the present invention showing a method to form a moldable capsule comprising micron conductive fiber.

Referring now to FIG. 9, a fifth preferred embodiment of the present invention is illustrated. A simplified schematic 200 of a manufacturing process to fabricate a moldable capsule 228 according to the present invention is shown. In the method 200 a continuous cable 220 of micron conductive fiber is routed into an extrusion apparatus 208. In this case, individual strands of the micron conductive fiber have been previously routed in parallel and wound onto a spool 204. In an alternative embodiment, not shown, a plurality of spools each containing a winding of a single strand or of a plurality of strands are used, and this plurality of strands is combined as a parallel cord 220 and fed into the extrusion apparatus 208.

The extrusion apparatus 208 is loaded with a resin-based material. A single co-extrusion of the resin-based material onto the continuous micron fiber bundle 220 is performed in the extrusion apparatus. This co-extrusion produces a continuous wire-like cable 224 comprising the micron fiber bundle radially surrounded by the resin-based material. Preferably, the co-extrusion apparatus uses a high-speed extrusion method, such as a pultrusion apparatus, like that used to manufacture conductive wiring. As a very important feature of the present invention, the resin-based material is carefully extruded such that the percent, by weight, of the micron conductive fiber 220 in the resulting wire-like cable 224 is carefully controlled. More particularly, in one embodiment, the micron conductive fiber core 220 comprises between about 20% and about 50% of the total weight of the wire-like cable 224. In a more preferred embodiment, the micron conductive fiber core 220 comprises between about 20% and about 40% of the total weight of the wire-like cable 224. In a yet more preferred embodiment, the micron conductive fiber core 220 comprises between about 25% and about 35% of the total weight of the wire-like cable 224. In a yet more preferred embodiment, the micron conductive fiber core 220 comprises between about 30% of the total weight of the wire-like cable 224.

The continuous wire-like cable 224 output from the extrusion apparatus 208 is then fed into a segmentation apparatus 212, or pelletizer, where the wire-like cable 224 is segmented into individual moldable capsules 228 and deposited into a bulk carrier 216. The moldable capsules 228 are preferably segmented to a length L of between about 2 millimeters and about 14 millimeters although longer or shorter lengths may be used. The segmenting method may be by cutting, sawing, chopping, stamping, and the like. The moldable capsules 228 retain the same percent, by weight, specification as the wire-like cable 224.

The above-described method and apparatus for forming the moldable capsule of FIG. 1 may be altered slightly to produce the moldable capsule according to FIG. 8b according to another preferred embodiment of the present invention. In this embodiment, the resin-based material that is loaded into the extrusion apparatus is pre-loaded mixed with a micron conductive powder. As a result, the resin-based material that is co-extruded onto the micron conductive fiber 220 carries a loading of micron conductive powder. This process method is designed and carefully controlled to produce a resulting wire-like cable 224 having a percent, by weight, of the combined micron conductive fiber and the micron conductive powder within the specified range of the present invention. In one embodiment, the combined micron conductive fiber and micron conductive powder comprises between about 20% and about 50% of the total weight of the wire-like cable 224. In a more preferred embodiment, the combined micron conductive fiber and micron conductive powder comprises between about 20% and about 40% of the total weight of the wire-like cable 224. In a yet more preferred embodiment, the combined micron conductive fiber and micron conductive powder comprises between about 25% and about 35% of the total weight of the wire-like cable 224. In a yet more preferred embodiment, the combined micron conductive fiber and micron conductive powder comprises between about 30% of the total weight of the wire-like cable 224.

Figure 10:
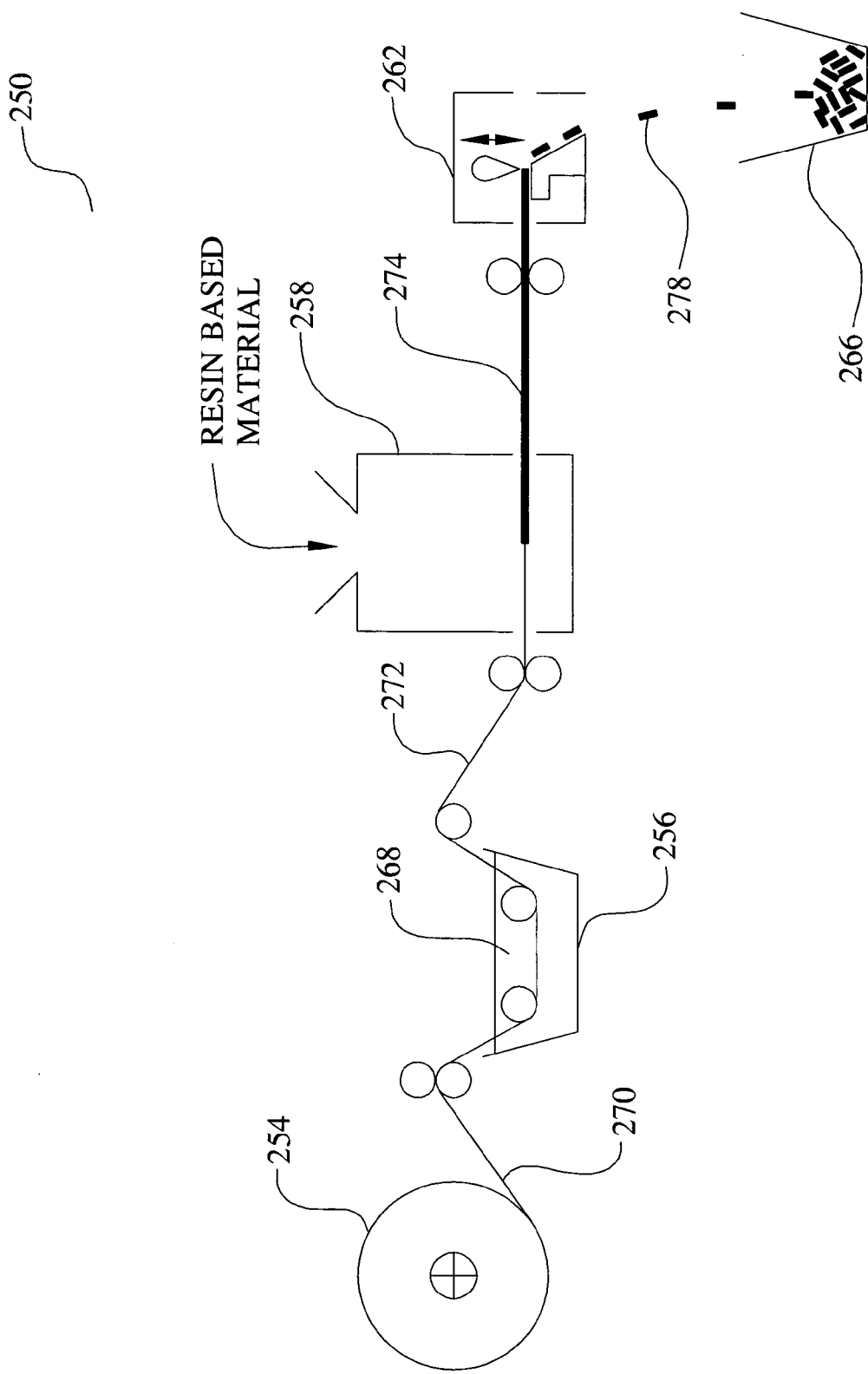
FIG. 10 illustrates a sixth preferred embodiment of the present invention showing a method to form a moldable capsule comprising micron conductive fiber and micron conductive powder.

Referring now to FIG. 10, a sixth preferred embodiment of the present invention is illustrated. A simplified schematic 250 of another manufacturing process to fabricate a moldable capsule 278 according to the present invention is shown. In the method 250 a continuous cable 270 of micron conductive fiber is first routed into a powdering apparatus 256 prior to routing into the extrusion apparatus 258. The powdering apparatus 256 preferably comprises a solution 268 comprising micron conductive powder suspended in a liquid media. As the continuous cable 270 is fed through the liquid media, the micron conductive powder leeches into the micron conductive fiber 270 to generate cable 272 that is fed into the extrusion apparatus 258. Again, individual strands of the micron conductive fiber have been previously routed in parallel and wound onto a spool 254. In an alternative embodiment, not shown, a plurality of spools each containing a winding of a single strand or of a plurality of strands are used, and this plurality of strands is combined as a parallel cord 270 and fed into the powdering apparatus 256.

The extrusion apparatus 258 is loaded with a resin-based material. A single co-extrusion of the resin-based material onto the powdered, continuous micron fiber bundle 272 is performed in the extrusion apparatus 258. This co-extrusion produces a continuous wire-like cable 274 comprising the powdered, micron fiber bundle 272 radially surrounded by the resin-based material. Preferably, the co-extrusion apparatus uses a high-speed extrusion method, such as a pultrusion apparatus, like that used to manufacture conductive wiring. As a very important feature of the present invention, the resin-based material is carefully extruded such that the percent, by weight, of the combined, micron conductive fiber and micron conductive powder 272 in the resulting wire-like cable 274 is carefully controlled. More particularly, in one embodiment, the combined, micron conductive fiber and micron conductive powder 272 comprises between about 20% and about 50% of the total weight of the wire-like cable 274. In a more preferred embodiment, the combined, micron conductive fiber and micron conductive powder 272 comprises between about 20% and about 40% of the total weight of the wire-like cable 274. In a yet more preferred embodiment, the combined, micron conductive fiber and micron conductive powder 272 comprises between about 25% and about 35% of the total weight of the wire-like cable 274. In a yet more preferred embodiment, the combined, micron conductive fiber and micron conductive powder 272 comprises between about 30% of the total weight of the wire-like cable 274.

The continuous wire-like cable 274 output from the extrusion apparatus 258 is then fed into a segmentation apparatus 262, or pelletizer, where the wire-like cable 274 is segmented into individual moldable capsules 278 and deposited into a bulk carrier 266. The moldable capsules 278 are preferably segmented to a length L of between about 2 millimeters and about 14 millimeters although longer or shorter lengths may be used. The segmenting method may be by cutting, sawing, chopping, stamping, and the like. The moldable capsules 278 retain the same percent, by weight, specification as the wire-like cable 274.

Figure 11A:
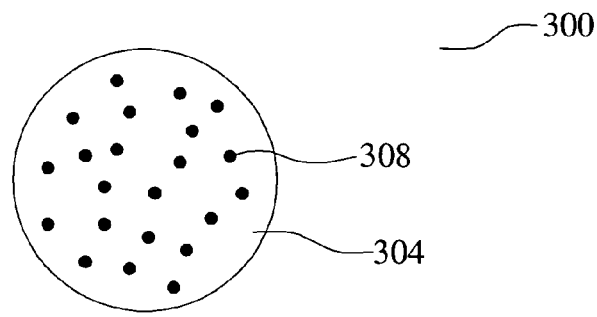
FIGS. 11a through 11c illustrate a seventh preferred embodiment of the present invention showing a moldable capsule with a core comprising resin-based material and incorporated micron conductive powder, with micron conductive fiber wound around the core, and with a second layer of resin-based material radially surrounding the wound fiber layer.
Figure 11B:
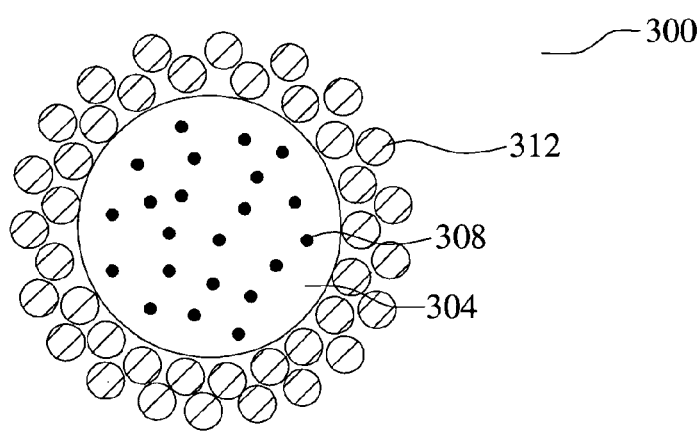
Figure 11C:
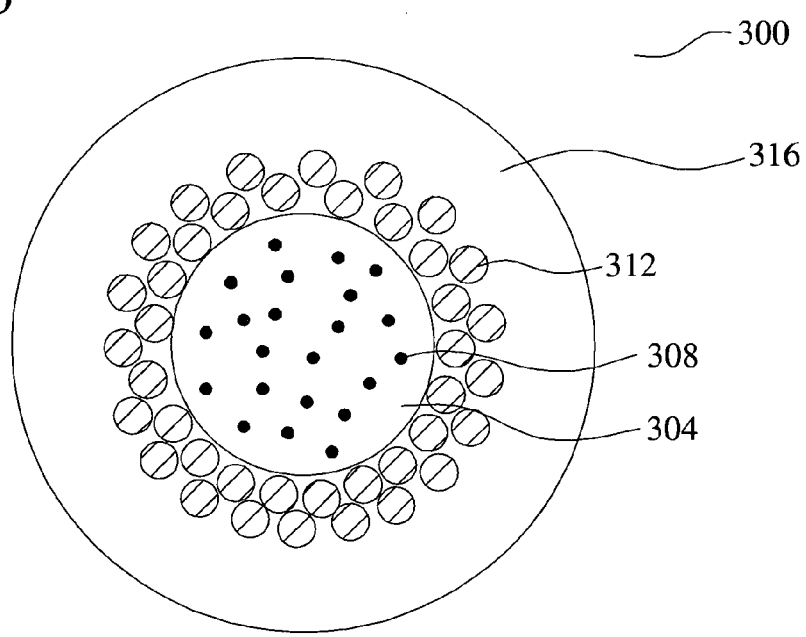

FIGS. 11a through 11c illustrate a seventh preferred embodiment of the present invention. A moldable capsule 300 is shown, in cross section. In this embodiment, the moldable capsule 300 comprises a core of resin-based material 304 loaded with micron conductive powder 308. A layer of micron conductive fiber 312 radially surrounds this inner core 304 and 308. Finally, a second layer of resin-based material 316 radially surrounds the micron conductive fiber layer 312. This embodiment provides a unique and particularly useful moldable capsule 300. In this case, the inverted configuration of the capsule will cause the fiber content 312 to be slow released before the powder content 308. Preferably, the inner and outer base resin materials 304 and 316 comprises the same resin material. The micron conductive powder 308 acts as a conductor, along with the micron conductive fiber 312, in the conductive loading network of the resulting molded article. Again, the percentage, by weight, of the combined micron conductive fiber 312 and micron conductive powder 308 in the moldable capsule 300 is formulated and controlled within the ranges herein described. In addition, the micron conductive powder 308 may act as a lubricant in the molding machine.

Figure 12:
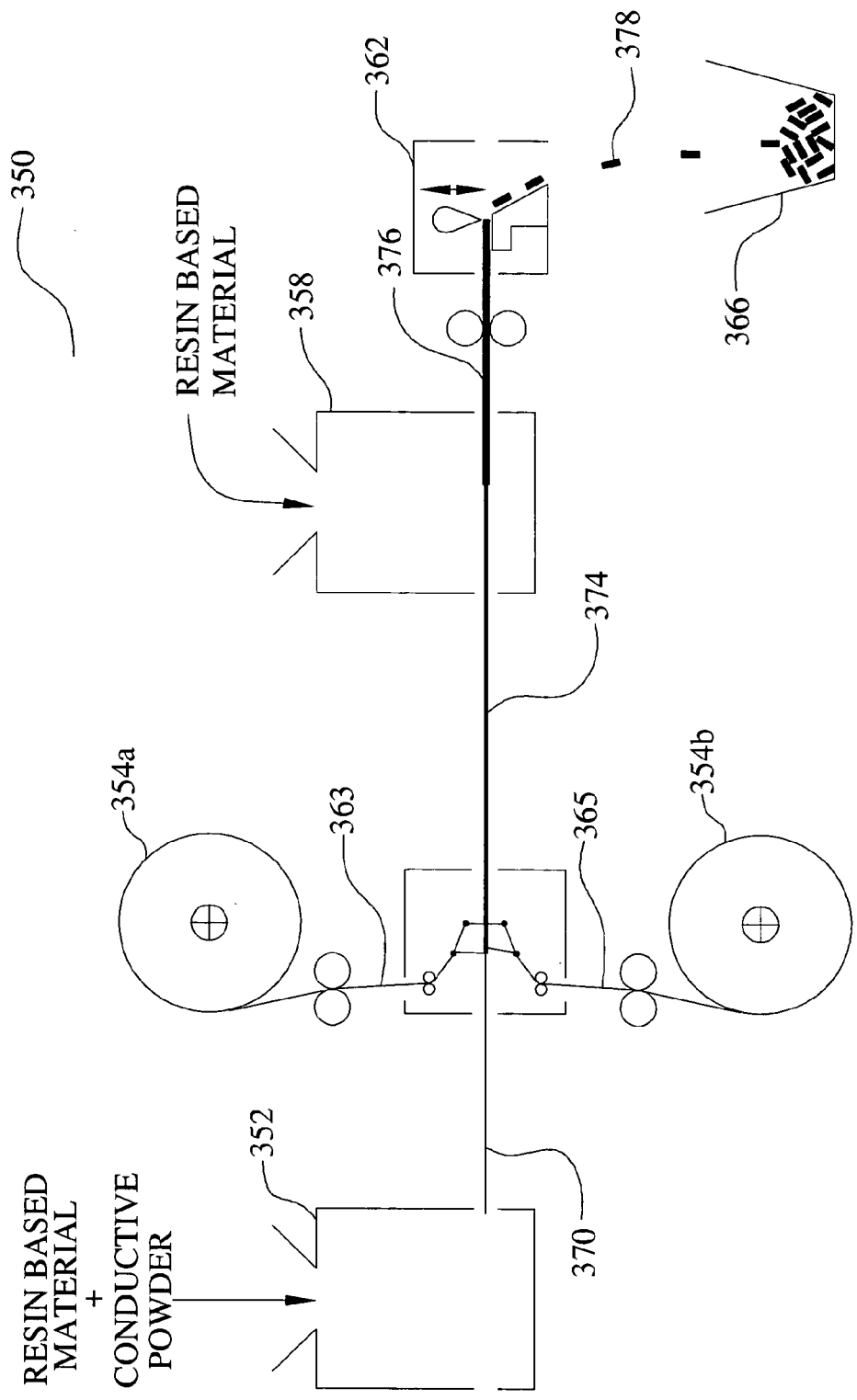
FIG. 12 illustrates an eighth preferred embodiment of the present invention showing a method to form the moldable capsule of FIGS. 11a through 11c.

Referring now to FIG. 12, an eighth preferred embodiment of the present invention is illustrated. In this embodiment 350, a method to form the moldable capsule of FIGS. 11a through 11c is shown. In the method 350, resin-based material with previously incorporated micron conductive powder is loaded into the first extruder 352. This resin-based material with previously incorporated micron conductive powder is melted and then extruded into a continuous, thin core 370. This thin core 370 corresponds to the core 308 and 304 of FIG. 11a. Referring again to FIG. 12, conductive loaded fiber cable 363 and 365 is wound onto the core 370 in a winding apparatus. The resulting continuous wire-like cable 374 corresponds to FIG. 11b. Referring again to FIG. 12, this second stage, wire-like continuous cable 374 is then fed into a second extrusion apparatus 358. Resin-based material is loaded into the second extruder 358 and melted. This resin-based material is co-extruded onto the second stage continuous cable 374 to form the third stage wire-like cable 376 shown in FIG. 11c.

Referring again to FIG. 12, as a very important feature of the present invention, the apparatus is carefully set to produce the third stage, wire-like cable 376 with a carefully controlled percent, by weight, of the combined micron conductive fiber and micron conductive powder. More particularly, in one embodiment, combined micron conductive fiber and micron conductive powder comprises between about 20% and about 50% of the total weight of the third stage, wire-like cable 376. In a more preferred embodiment, combined micron conductive fiber and micron conductive powder comprises between about 20% and about 40% of the total weight of the third stage, wire-like cable 376. In a yet more preferred embodiment, combined micron conductive fiber and micron conductive powder comprises between about 25% and about 35% of the total weight of the third stage, wire-like cable 376. In a yet more preferred embodiment, combined micron conductive fiber and micron conductive powder comprises between about 30% of the total weight of the third stage, wire-like cable 376.

The third stage, wire-like cable 376 output from the second extrusion apparatus 358 is then fed into a segmentation apparatus 362, or pelletizer, where the wire-like cable 376 is segmented into individual moldable capsules 378 and deposited into a bulk carrier 366. The moldable capsules 378 are preferably segmented to a length L of between about 2 millimeters and about 14 millimeters although longer or shorter lengths may be used. The segmenting method may be by cutting, sawing, chopping, stamping, and the like. The moldable capsules 378 retain the same percent, by weight, specification as the third stage, wire-like cable 224.

Figure 2:
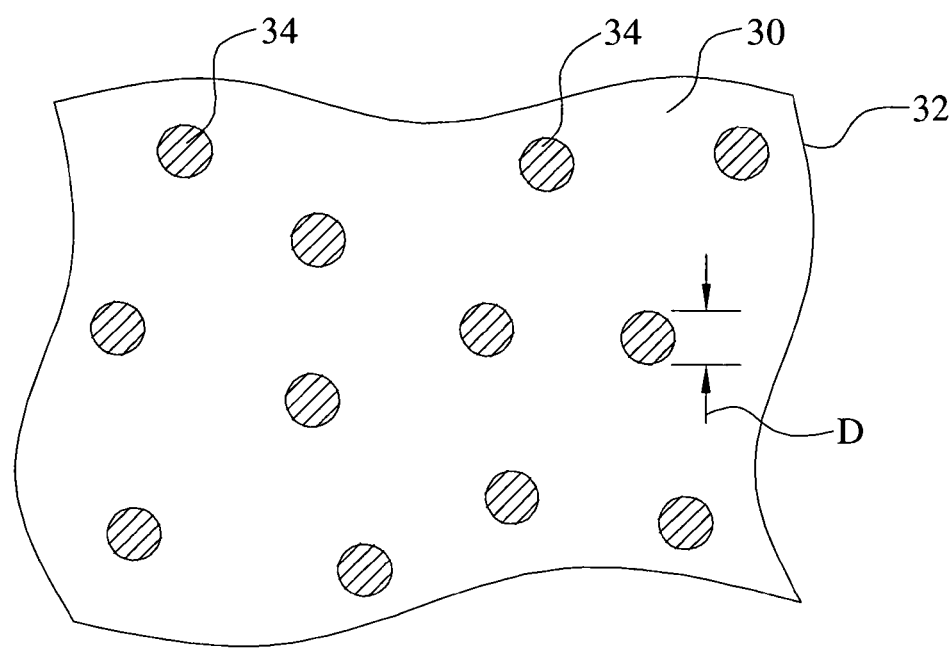
FIG. 2 illustrates a first preferred embodiment of a conductive loaded resin-based material wherein the conductive materials comprise a powder.

The several embodiments of moldable capsules according to the present invention are easily molded into manufactured articles by injection molding, extrusion molding, and the like. The resulting molded articles comprise an optimal, conductive loaded resin-based material. This conductive loaded resin-based material typically comprises a micron powder(s) of conductor particles and/or in combination of micron fiber(s) homogenized within a base resin host. FIG. 2 shows a cross section view of an example of conductor loaded resin-based material 32 having powder of conductor particles 34 in a base resin host 30. In this example the diameter D of the conductor particles 34 in the powder is between about 3 and 12 microns.

Figure 3:
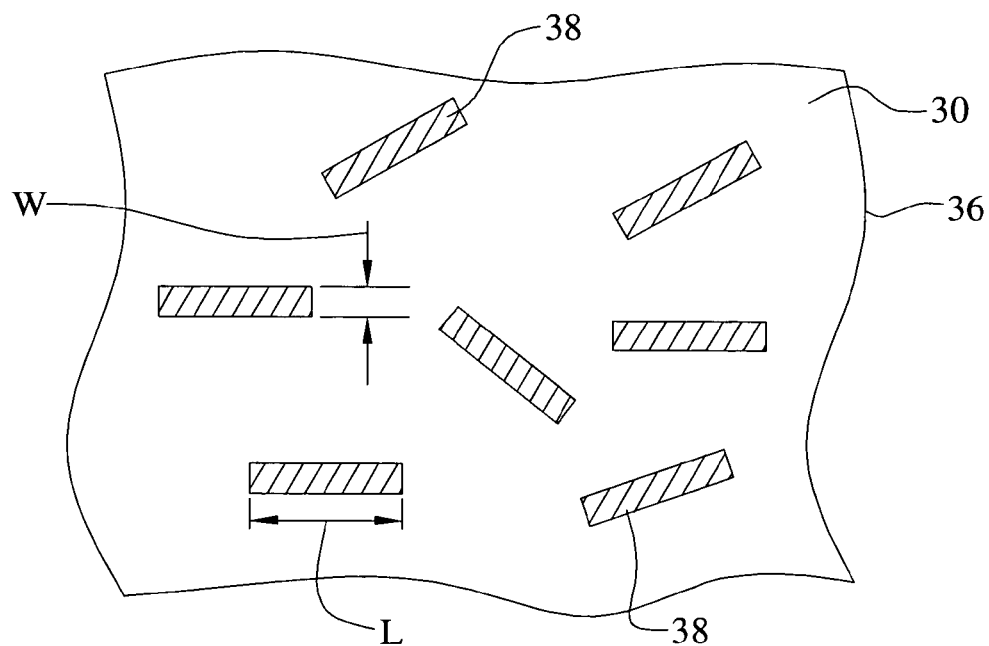
FIG. 3 illustrates a second preferred embodiment of a conductive loaded resin-based material wherein the conductive materials comprise micron conductive fibers.
Figure 4:
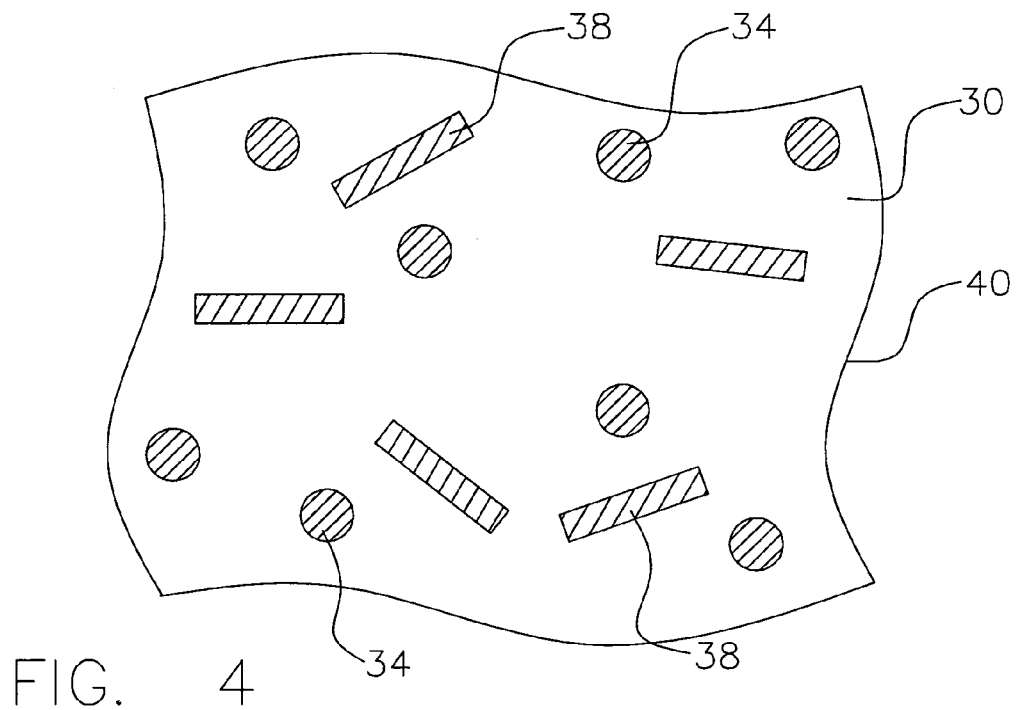
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the percentage, by weight, of the conductor material, in this example the conductor particles 34 or conductor fibers 38, is between about 20% and 40%, and is preferably about 30%. Stainless Steel Fiber of 8–11 micron in diameter and lengths of 4–6 mm with a percent fiber weight of 30% will produce a very highly conductive-parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
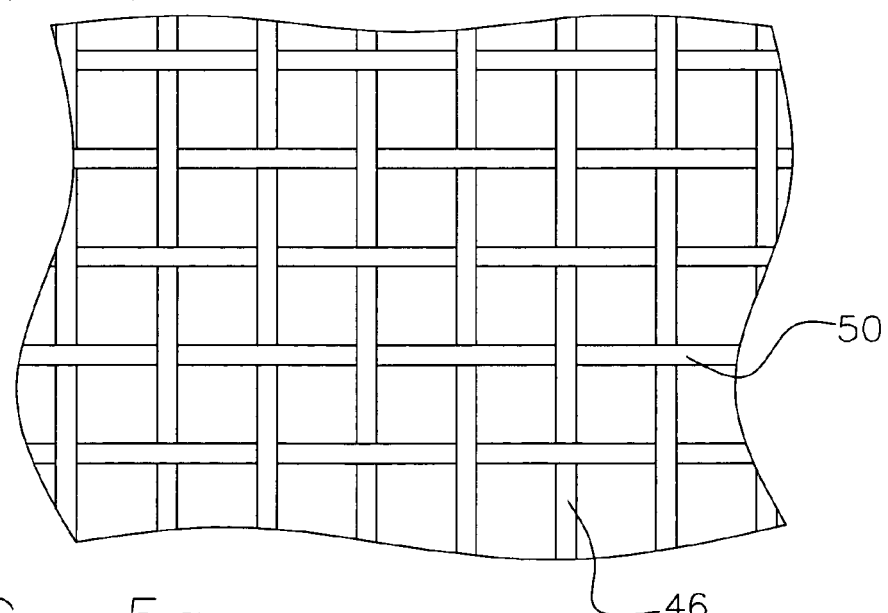

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Articles formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the articles are removed.

FIG. 6b shows a simplified schematic diagram of an extruder 70 for forming articles using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. An effective moldable capsule useful for molding conductive loaded resin-based articles is achieved. The moldable capsule exhibits optimal properties for time-releasing conductive material into the resin-based material during melting and mixing and prior to molding. The moldable capsule comprises a ratio of conductive loaded material and resin-based material for optimal performance of the molded article, and this ratio is pre-formed into the moldable capsule. It is not necessary to reduce the concentration of the conductive loaded material by mixing with pure plastic pellets. The moldable capsule may comprise various types of conductive loads and various types of base resin. A method to form a moldable capsule comprising conductive loaded resin-based material is achieved. A method to form a moldable capsule that is easily and predictably manufactured is achieved. A method to form a moldable capsule that is extendable to inclusion of more than one type of conductive loaded material into the capsule load is achieved. Methods to manufacture articles from the moldable capsule comprising a conductive loaded resin-based material are achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A moldable capsule comprising:
    an inner core comprising micron conductive powder in a first resin;
    a middle layer of micron conductive fiber radially surrounding said inner core; and
    an outer covering comprising a second resin radially surrounding said middle layer wherein combined said micron conductive powder and said micron conductive fiber comprise between 20% and 50% of the total weight of said moldable capsule.

2. The capsule according to claim 1 wherein said combined said micron conductive powder and said micron conductive fiber comprises between 20% and about 40% of the total weight of the said moldable capsule.

3. The capsule according to claim 1 wherein said combined said micron conductive powder and said micron conductive fiber comprises between about 25% and about 35% of the total weight of the said moldable capsule.

4. The capsule according to claim 1 wherein said combined said micron conductive powder and said micron conductive fiber comprises about 30% of the total weight of the said moldable capsule.

5. The capsule according to claim 1 wherein said micron conductive fiber is nickel plated carbon fiber.

6. The capsule according to claim 1 wherein said micron conductive fiber is stainless steel fiber.

7. The capsule according to claim 1 wherein said micron conductive fiber is copper fiber.

8. The capsule according to claim 1 wherein said micron conductive fiber is silver fiber.

9. The capsule according to claim 1 wherein said micron conductive fiber comprises a combination of nickel plated carbon fiber, stainless steel fiber, copper fiber, or silver fiber.

10. The capsule according to claim 1 wherein said micron conductive fiber has a diameter of between about 3 mm and about 12 mm and a length of between about 2 mm and about 14 mm.

11. The capsule according to claim 1 wherein said micron conductive powder comprises metal powder.

12. The capsule according to claim 11 wherein said metal powder is nickel.

13. The capsule according to claim 11 wherein said metal powder is copper.

14. The capsule according to claim 11 wherein said metal powder is silver.

15. The capsule according to claim 11 wherein said metal powder is a non-conductive material with a metal plating.

16. The capsule according to claim 15 wherein said metal plating is nickel or alloys thereof.

17. The capsule according to claim 15 wherein said metal plating is copper or alloys thereof.

18. The capsule according to claim 15 wherein said metal plating is silver or alloys thereof.

19. The capsule according to claim 11 wherein said metal powder has a diameter of between about 3 mm and about 12 mm.

20. The capsule according to claim 1 wherein said micron conductive powder comprise non-metal powder.

21. The capsule according to claim 20 wherein said non-metal powder is carbon.

22. The capsule according to claim 20 wherein said non-metal powder is graphite.

23. The capsule according to claim 20 wherein said non-metal powder is an amine material.

24. The capsule according to claim 1 wherein said micron conductive fiber is stainless steel and said micron conductive powder is graphite.

25. A method to form a moldable capsule comprising:
    extruding an inner core comprising a combination of a first resin and micron conductive powder;
    winding a micron conductive fiber layer around said inner core;
    extruding an outer covering of a second resin radially surrounding said micron conductive fiber layer; and
    sectioning said inner core, said micron conductive fiber layer, and said second resin into moldable capsules.

26. The method according to claim 25 wherein said combined said micron conductive powder and said micron conductive fiber comprise between about 20% and about 50% of the total weight of the said moldable capsule.

* * * * *